(12) United States Patent
Lee et al.

(10) Patent No.: US 7,576,364 B2
(45) Date of Patent: Aug. 18, 2009

(54) DISPLAY DEVICE AND METHOD OF MANUFACTURING THE SAME

(75) Inventors: Seok-Woon Lee, Tainan (TW);
Sung-Soo Park, Tainan (TW);
Biing-Seng Wu, Tainan (TW)

(73) Assignees: CHI MEI Optoelectronics Corp.,
Tainan County (TW); CHI MEI EL Corp., Tainan County (TW)

( * ) Notice: Subject to any disclaimer, the term of this patent is extended or adjusted under 35 U.S.C. 154(b) by 182 days.

(21) Appl. No.: 11/706,222

(22) Filed: Feb. 15, 2007

(65) Prior Publication Data

US 2008/0197342 A1 Aug. 21, 2008

(51) Int. Cl.
*H01L 33/00* (2006.01)
(52) U.S. Cl. ............... 257/95; 257/94; 257/E33.001; 438/22; 438/23
(58) Field of Classification Search .............. 257/40, 257/79, 94, 95, 97, 103, E33.001, E51.018, 257/E51.022; 438/22, 23
See application file for complete search history.

(56) References Cited

U.S. PATENT DOCUMENTS

| 6,492,778 | B1 | 12/2002 | Segawa et al. |
| 6,586,327 | B2 | 7/2003 | Shepard |
| 6,687,268 | B2 * | 2/2004 | Kitamura et al. ............. 372/22 |
| 7,102,175 | B2 * | 9/2006 | Orita .......................... 257/97 |
| 2005/0161680 | A1 | 7/2005 | Kawakami et al. |
| 2005/0218792 | A1 | 10/2005 | Jianpu et al. |
| 2006/0008931 | A1 | 1/2006 | Lee et al. |
| 2006/0244005 | A1 * | 11/2006 | Chen ......................... 257/122 |
| 2008/0067932 | A1 * | 3/2008 | Baek et al. ................... 313/509 |

* cited by examiner

*Primary Examiner*—Phuc T Dang
(74) *Attorney, Agent, or Firm*—Rabin & Berdo, PC

(57) ABSTRACT

A display device and its method of manufacture. The display device is formed to include a substrate having an upper surface, a recess region having a bottom surface and sidewalls, a light-emitting element and a switch element. The light-emitting element includes a first electrode disposed on the recess region, a light-emitting layer disposed on the first electrode, and a second electrode disposed on the light-emitting layer. The switch element is disposed on the substrate and electrically connected to the light-emitting element. The bottom surface of the recess region is lower than the bottom surface of the active layer.

31 Claims, 10 Drawing Sheets

DISPLAY DEVICE AND METHOD OF MANUFACTURING THE SAME

BACKGROUND OF THE INVENTION

1. Field of the Invention

The invention relates in general to a display device and a method of manufacturing the same, and more particularly to a light-emitting display device and a method of manufacturing the same.

2. Description of the Related Art

An organic light-emitting display device, which is a self-emissive device, advantageously has the properties of being driven by a low DC voltage, high luminance, high efficiency, high contrast, light weight, reduced thickness, and flexibility, and thus is expected to be in the mainstream of the next generation of flat panel displays.

FIG. 1 is a schematic illustration showing a conventional organic light-emitting display device 100. The organic light-emitting display device 100 includes sub-pixels 110 arranged in a matrix. Each sub-pixel 110 includes a switch element 120 and a light-emitting element 130. The switch element 120 is typically a thin film transistor (TFT) for driving the light-emitting element 130, and the light-emitting element 130 is typically an organic light-emitting diode (OLED). As shown in FIG. 1, the switch element 120 includes a gate electrode 121, a source 122 and a drain 123. The light-emitting element 130 includes a first electrode 131, a second electrode 132 and a light-emitting layer 133. The light-emitting layer 133 could be a single organic film or a multi-layer structure including several organic thin films, depending on the practical application. The first electrode 131 is disposed on the insulating layer 111 and fills a contact hole 111a for electrically connecting the light-emitting element 130 and the switch element 120. The switch element 120 provides a driving voltage or current to the light-emitting element 130 and controls the light-emitting element 130 to emit light.

In general, the method of manufacturing the display device 100 is mainly divided into processes of manufacturing the switch element 120 and processes of manufacturing the light-emitting element 130. During the manufacturing steps, especially in the processes of manufacturing the switch element 120, it is inevitable that undesired particles, such as dust in unclean air or processing machines, or impurities in the materials, contaminate the display device. If a single undesired particle becomes enclosed by any layer of the display device, the layers subsequently formed above the particles will be uneven, and the formation of abnormal protrusions could cause a short circuit. Besides, if undesired particles attach to the light-emitting area (i.e. the pixel area), it could cause image defects due to light scattering or light absorption by the undesired particles, and the production yield of display devices would therefore be reduced.

FIG. 2A~FIG. 2C schematically illustrate a defect in the process of manufacturing the conventional display device 100. Firstly referring to FIG. 2A, a substrate 140 is provided with a buffer layer 141 on its upper surface 140a. Next referring to FIG. 2B, a switch element 120 comprising a gate electrode 121, source 122, and drain 123 is formed. In the process of manufacturing the switch element 120, it is assumed that particles 191 are allowed accidentally to fall on and attached to the films. Afterward, a light-emitting element 130 comprising a first electrode 131, a light-emitting layer 133 and a second electrode 132 is formed, as shown in FIG. 2C. Also, the first electrode 131 fills in the contact hole 11 1a for electrically connecting the light-emitting element 130 and the switch element 120. When one of the particles 191 has fallen on an area to become a light-emitting area P, it causes a protrusion to be formed in the first electrode 131 overlaying it, possibly leading the first electrode 131 and the second electrode 132 to be short-circuited as shown in the figure.

Besides the undesirable particles, grain growth during the silicon crystallization could cause defects to occur in a display device. FIG. 3 is a schematic illustration showing another possible defect in the conventional display device 100. Since the trend of display devices has been to build logic circuits and memory circuits in a display substrate, a low temperature polysilicon (LTPS) manufacturing process has been developed in consideration of the demands of limitations on heat-resistance of the substrate, high integration and high carrier mobility. The polycrystallization methods of the LTPS manufacturing process mainly include an excimer laser annealing (ELA) process or a metal induced crystallization (MIC) process. In addition to the problem of the particle adhesion in the manufacturing processes, the display device 100 manufactured by the LTPS process further encounters the problem of the residue on the active layer 124. With regard to the excimer laser annealing method applied in the process of the crystallization of the active layer 124, the grains at the grain boundary may jostle against the others and be ridged due to the stress in their own growth and that of neighboring grains. After etching the active layer 124, the protrusions 150 due to active layer residues can cause roughness on top of the buffer layer 141. In addition, with regard to the metal-induced crystallization method, with nickel di-silicide ($NiSi_2$) trapped at a grain boundary, the protrusions 150 could also be formed and cause an unsmooth surface of the buffer layer 141. Similarly, after a subsequent evaporation process in the formation of the light-emitting element 130 is finished, the first electrode 131 and the second electrode 132 may become short-circuited due to a series of laminated protrusions.

As mentioned hereinabove, both the polysilicon process and the amorphous silicon process may encounter the problem of particle generation in the processes of manufacturing the display device. The low temperature polysilicon manufacturing process may have a further problem of an unsmooth surface (for example, protrusions 150) of the buffer layer 141. A new display device structure provided according to the invention is able to prevent the above-mentioned problems in the light-emitting or pixel area.

SUMMARY OF THE INVENTION

It is therefore an object of the invention to provide a display device and a method of manufacturing the same, that solves such problems as undesirable particles fallen on the films and an unsmooth surface of the display device in the light-emitting or pixel area. By solving these problems, the production yield can be greatly improved, and the manufacturing cost can be reduced.

According to a first aspect of the invention a display device includes a substrate, a recess region, a light-emitting element and a switch element. The substrate has an upper surface, and the recess region has a bottom surface and sidewalls. The light-emitting element includes a first electrode disposed on the recess region. The first electrode is separated from the substrate by a barrier layer. A light-emitting layer is disposed on the first electrode. A second electrode is disposed on the light-emitting layer. The switch element is disposed on the substrate and electrically connected to the light-emitting element. The bottom surface of the recess region is lower than the bottom surface of the active layer.

According to a second aspect of the invention a display device includes a substrate having an upper surface, and a plurality of sub-pixels. Each sub-pixel includes a recess region having a bottom surface and sidewalls, a light-emitting element, a switch element and an active layer. The light-emitting element includes first and second electrodes, a barrier layer, and a light-emitting layer. The first electrode is disposed on the recess region, separated from the substrate by the barrier layer. The light-emitting layer is disposed on the first electrode, and the second electrode is disposed on the light-emitting layer. The switch element includes a gate electrode, a source and a drain. The switch element is disposed on the substrate upper surface and electrically connected to the light-emitting element. The active layer is disposed on the barrier layer and electrically connected to the source and drain, wherein the bottom surface of the recess region is lower than the bottom surface of the active layer.

According to a third aspect of the invention a method of manufacturing a display device includes the following steps: An active layer is formed on an upper surface of a substrate. A switch element also is formed on the substrate. A recess region is formed with a bottom surface below the bottom surface of the active layer, and sidewalls. A light-emitting element is formed on the recess region, electrically connected to the switch element, with a barrier layer between the light-emitting element and the substrate.

The structure of the device and its method of manufacture therefore each assure that any material on which a particle directly may have fallen or on which protusions otherwise have formed, during the process of forming the switch element, in an area where the light-emitting element is to be formed, will be removed along with the any particle and/or protrusion during the formation of the recess region. Other objects, features, and advantages of the invention will become apparent from the following detailed description of the preferred but non-limiting embodiments. The following description is made with reference to the accompanying drawings.

DETAILED DESCRIPTION OF THE INVENTION

According to the invention, a method of manufacturing display device can be used to solve the short-circuit problems described above with respect to the prior art. Also, two (first and second) illustrative embodiments of a display device according to the invention are described. The bottom surfaces of the recess regions of the display devices according to these first and second embodiments are formed respectively above and beneath the upper surface of the substrate It is to be noted that the embodiments disclosed herein are intended to illustrate the invention, but not to limit the scope of the invention. Additionally, the drawings used for illustrating the embodiments and applications of the invention only show the major characteristic parts in order to avoid obscuring the invention. Accordingly, the specification and the drawings are to be regarded in an illustrative sense rather than a restrictive sense.

First Embodiment

FIG. 4A~FIG. 4F are cross-sectional views showing a method of manufacturing a display device according to the first embodiment of the invention. In the first embodiment, the bottom surface of the recess region is formed above the substrate.

Figure 4A:
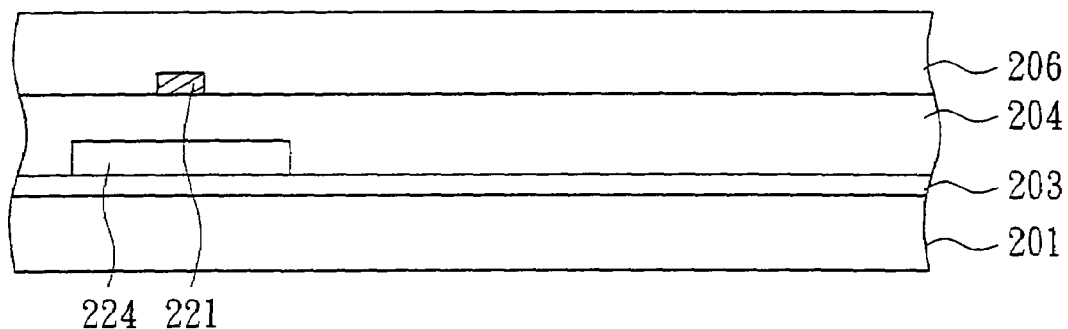
FIG. 4A~FIG. 4F are cross-sectional views showing a method of manufacturing a display device according to the first embodiment of the invention.

First, a substrate 201 is provided, and at least a buffer layer 203 (as a barrier layer) is formed on the upper surface of the substrate 201. The substrate 201 could be made of rigid or soft material. In this embodiment, a hard glass is used as the substrate 201. The buffer layer 203 could be a single layer or multiple layers (comprising oxide and nitride layers). In this embodiment, a single layer of silicon oxide with a thickness of 3000 angstrom is used as the buffer layer 203. Then, an active layer 224 (for example: a amorphous silicon or poly-silicon layer) is formed on the buffer layer 203, and a first material layer in the form of a gate insulating layer 204 is formed on the buffer layer 203 and covers the active layer 224, as shown in FIG. 4A. Next, a gate electrode 221 is formed on the gate-insulating layer 204, and second material layer in the form of a dielectric layer 206 is formed on the gate-insulating layer 204 for covering the gate electrode 221. The gate-insulating layer 204 could be made of silicon oxide, and the dielectric layer 206 could be a single layer or a multiple layer (comprising, for example, oxide and nitride layers). In this embodiment, a single gate insulating layer 204 is shown for illustrative purposes, but actually a multiple layer structure with an upper layer made of silicon nitride with a thickness of 300 angstrom and a lower layer made of silicon oxide with thickness of 500 angstrom, is used in this embodiment. Also, a single dielectric layer 206 is shown for purposes of illustration, but actually using a multiple layer structure having an upper layer made of silicon oxide with a thickness of 3300 angstrom and a lower layer made of silicon nitride with a thickness of 3500 angstrom, is used in this embodiment. In addition, a first metal layer (not shown in FIG. 4A) could be disposed on the gate-insulating layer 204 and then patterned to form the gate electrode 221. The gate electrode could be made of molybdenum with a thickness of 2500 angstrom, or aluminum alloy, or other conducting material.

Figure 4B:
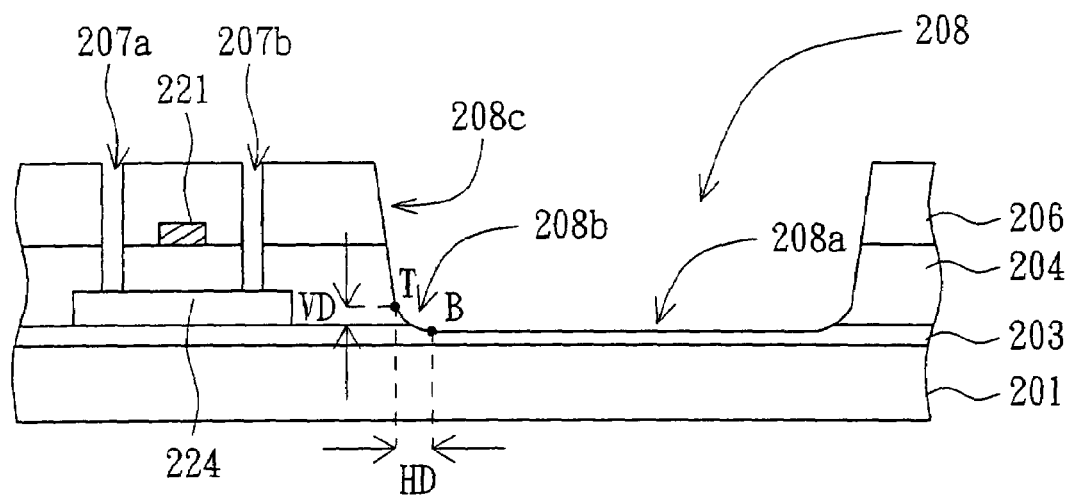

Next, a recess region 208 having a bottom surface 208a, sidewalls 208c, and an inclined surface 208b extending from the bottom surface to the sidewalls, is formed by removing portions of the gate-insulating layer 204 and dielectric layer 206 external to the switch element, to expose the surface of the buffer layer 203, as shown in FIG. 4B. The recess region 208 could be formed by dry etching, wet etching, or a combination thereof. Also, holes 207a and 207b are formed to expose part of the surface of the active layer 224.

Figure 4C:
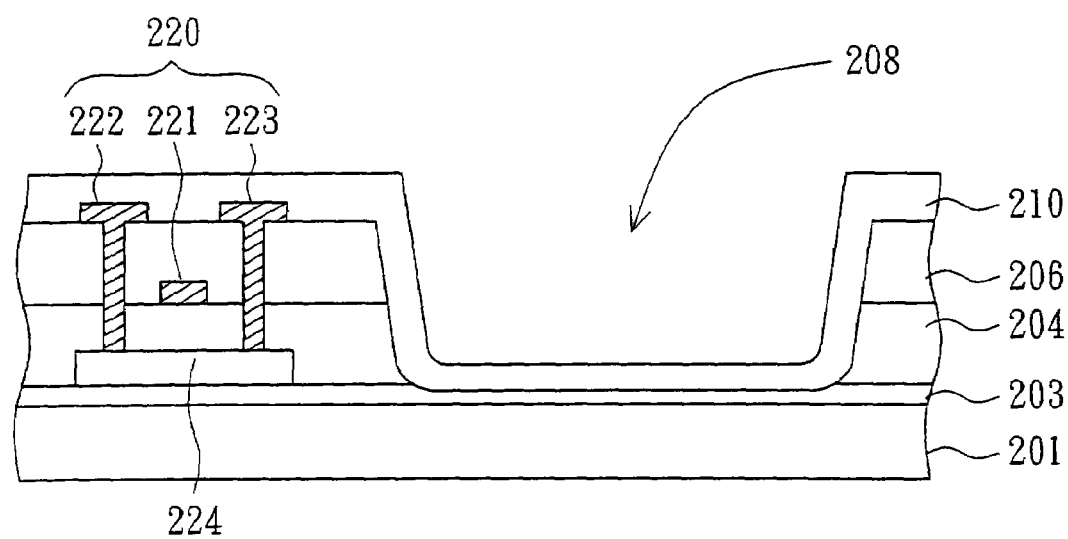

Afterward, a second metal layer (not shown) is disposed on the dielectric layer 206 and then patterned to form the source 222 and the drain 223 shown in FIG. 4C. The holes 207a and 207b (FIG. 4B) are filled with the second metal layer as further shown in FIG. 4C. Thus, the source 222 and the drain 223 are electrically connected to the active layer 224 through the second metal layer. A switch element 220, including the gate electrode 221, source 222 and drain 223, now has been constructed on the substrate 201. Then, an insulating layer 210, such as a silicon nitride layer, is deposited on the dielectric layer 206 to cover source 222, drain 223, and recess region 208.

Figure 4D:
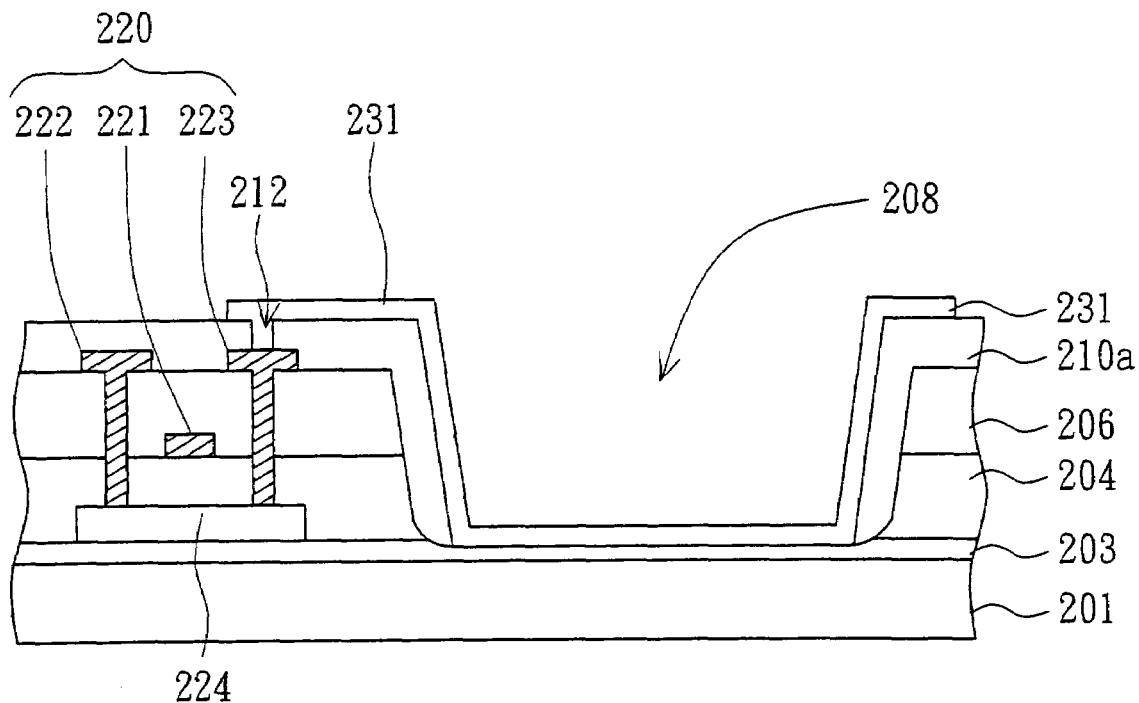

Next, the insulating layer 210 of FIG. 4C is partially removed to expose the surface of the buffer layer 203, and the insulating layer 210 attached to the sidewalls of the recess region 208 remains, as shown in FIG. 4D. The insulating layer 210 could be a single layer or a multiple layer (made of silicon oxide, silicon nitride, or organic layers). In this embodiment, a single layer of silicon nitride with thickness of 3000 angstrom forms the insulating layer 210. No insulating layer remains on the bottom side of the recess region 208. Also, a contact hole 212 is formed on the insulating layer 210a to expose part of the drain 223. Then, a first electrode 231, such as a transparent indium tin oxide (ITO) layer, is formed and patterned above the insulating layer 210a. The first electrode 231 covers the recess region 208, and fills the contact hole 212 for electrically connecting the drain 223. As shown in FIG. 4D, the buffer layer 203 is disposed between the first electrode 231 and the substrate 201 at the bottom side of the recess region 208; the insulating layer 210a is disposed between the first electrode 231 and the dielectric layer 206 at the sidewalls of the recess region 208.

Figure 4E:
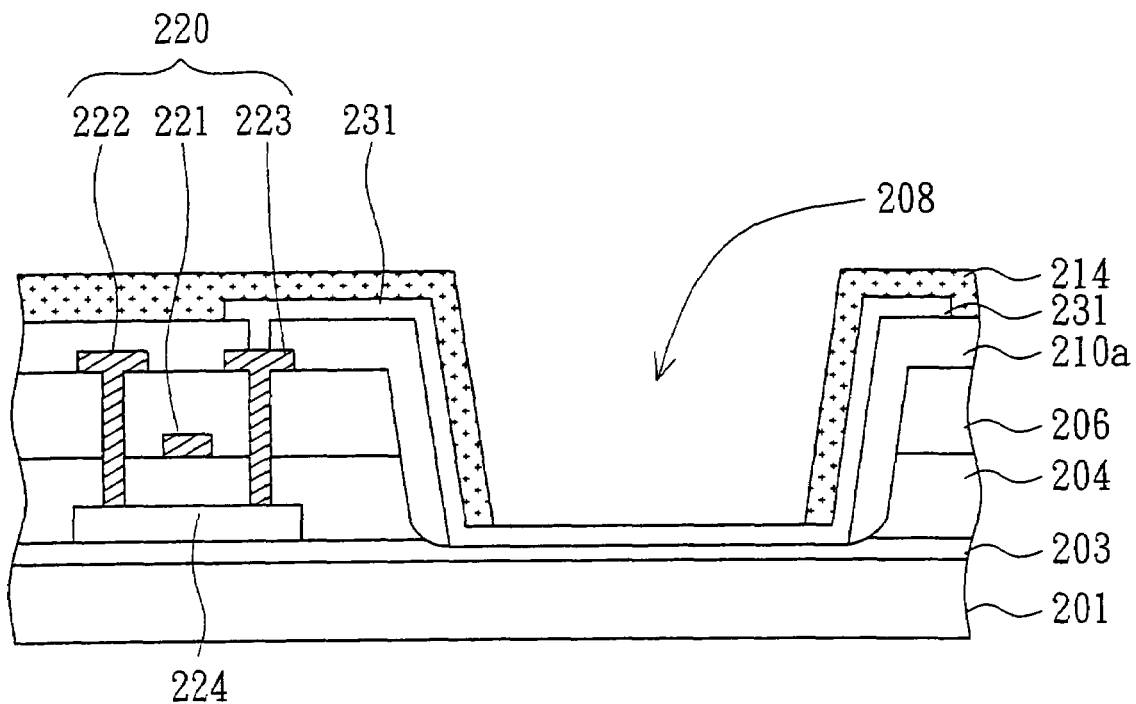

Next, a passivation layer 214 is formed above the insulating layer 210a, covering the first electrode 231, and a part of the passivation layer 214 then is removed to expose the bottom side of the recess region 208, as shown in FIG. 4E. As further shown in FIG. 4E, the passivation layer 214 is formed at the sidewalls of the recess region 208, but no passivation residues remain at the bottom side of the recess, region 208. The passivation 214 could be made of silicon oxide, silicon nitride, or organic layer. In this embodiment, a single layer of organic layer with a thickness of 1 micrometer forms the passivation layer 214.

Figure 4F:
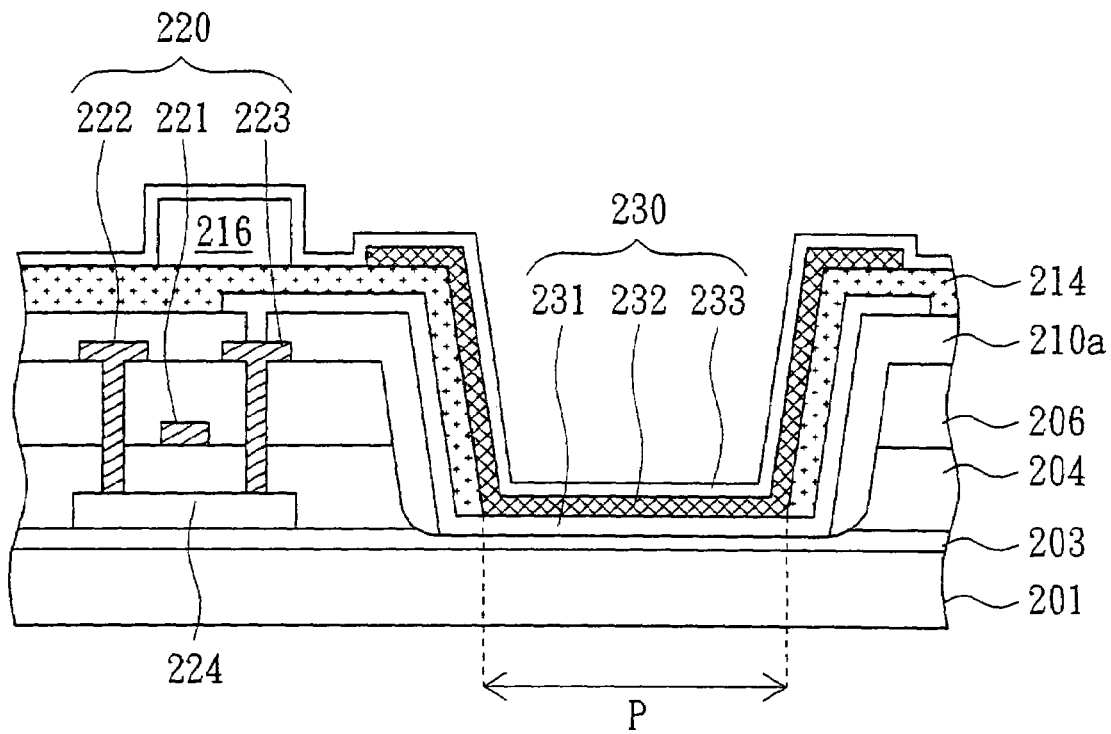

Referring to FIG. 4F, next a spacer 216 optionally is formed on the passivation layer 214 for supporting the shadow mask, which is used to define the deposition area of the following light-emitting layer. Subsequently, a light-emitting layer 232 (such as multiple organic electroluminescent layers) is formed on the passivation layer 214, and a second electrode 233 is formed to cover the spacer 216 and the light-emitting layer 232. The light-emitting element 230, including the first electrode 231, the light-emitting layer 232 and the second electrode 233, has now been constructed. It is noted that in this embodiment, the light-emitting layer 232 contacts the first electrode 231 only at the bottom side of the recess region 208 (within the light-emitting (pixel) area denoted as "P"). The light-emitting layer 232 and the first electrode 231 are separated by the passivation layer 214 at the sidewalls of the recess region 208.

Figure 1:
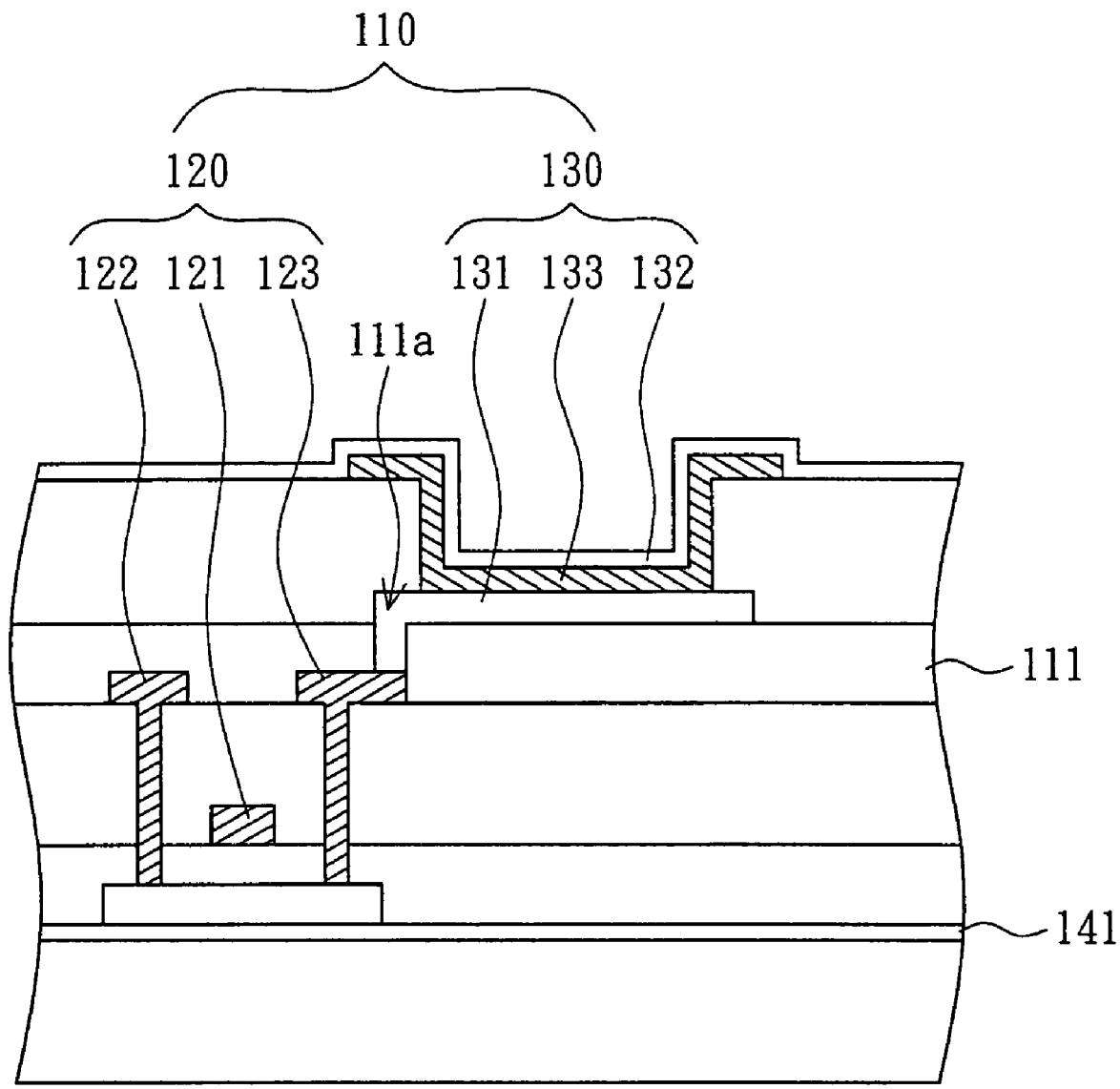
FIG. 1 (Prior Art) is a schematic illustration showing a conventional organic light-emitting display device.
Figure 2A:
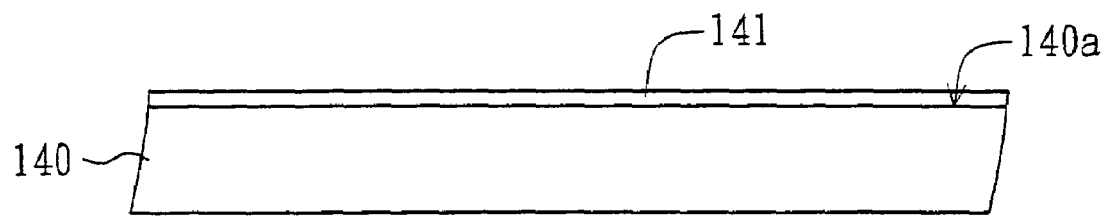
FIG. 2A~FIG. 2C (Prior Art) is a schematic illustration showing a type of defect created in the process of forming the conventional display device.
Figure 2B:
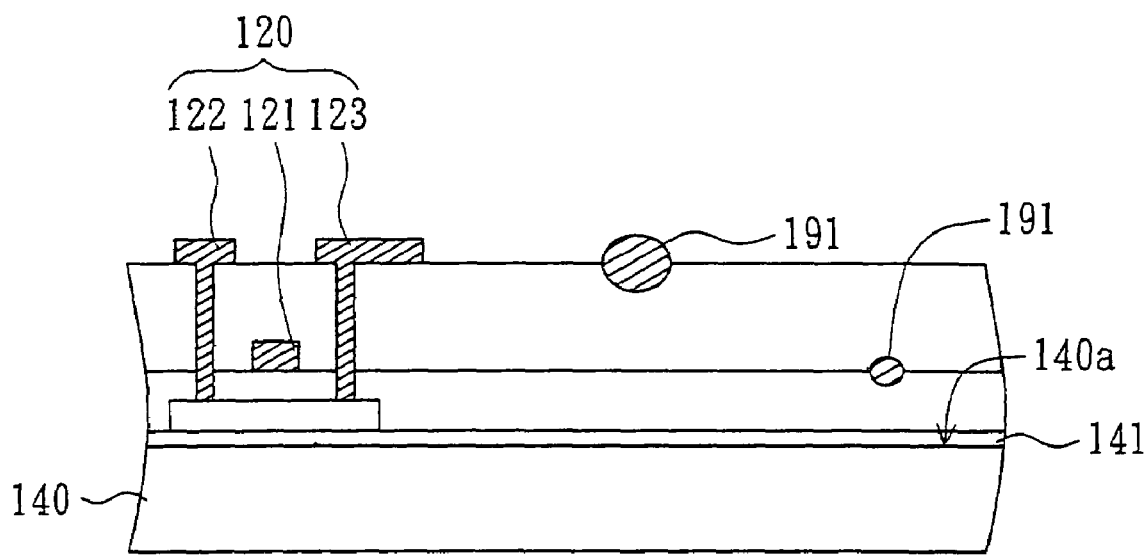
Figure 2C:
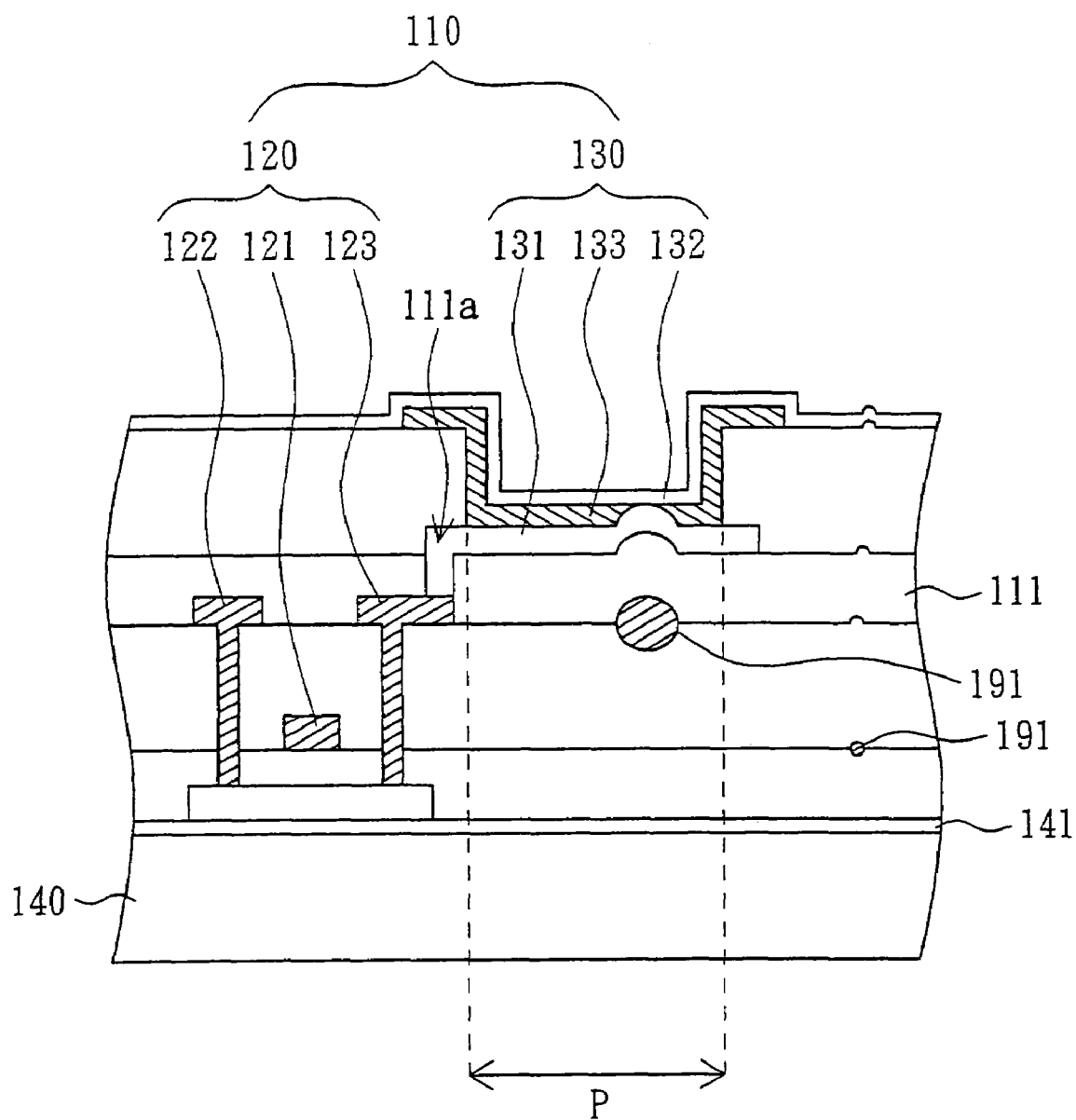
Figure 3:
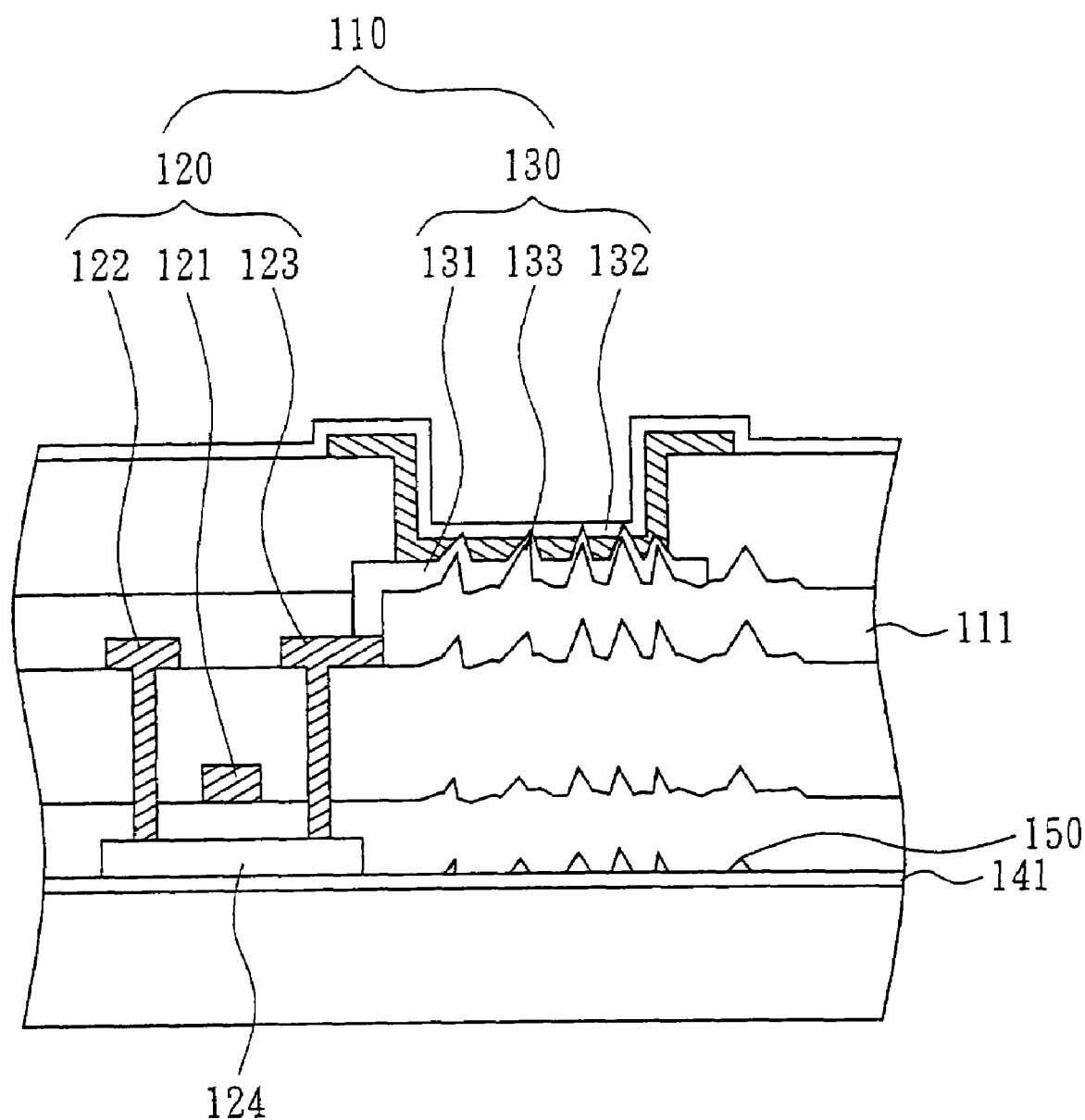
FIG. 3 (Prior Art) is a schematic illustration showing another type of defect created in the process of forming the conventional display device.

According to the method of the first embodiment, the bottom surface of the recess region 208 is lower than the bottom surface of the active layer 224; therefore, defects such as those produced by the undesirable particles 191 shown in FIG. 2C, and the protrusions shown in FIG. 3, can be removed, and the display quality can be improved. Also, the method possesses the advantage of a resulting taper-angle improvement that the gate insulating layer 204 and the dielectric layer 206 are covered by the insulating layer 210a. With the insulating layer 210a formed at the sidewalls of the recess region 208, the layers subsequently laminated on the insulating layer 210a can be well deposited layer-by-layer. Moreover, the sizes of the respective openings in the gate insulating layer 204, the dielectric layer 206, the insulating layer 210a and the passivation layer 214 in the recess region 208 successively decrease gradually (i.e. the gate insulating layer 204 has the largest opening in the recess region 208, and the passivation layer 214 has the smallest opening in the recess region 208).

Furthermore, the recess region 208 has the following feature. As noted above and shown in FIG. 4B, the recess region 208 has a recess region bottom surface 208a, and an inclined surface 208b, which inclines from the recess region bottom surface 208a to the sidewalls 208c. In addition, a horizontal distance HD between a top end T to a bottom end B of the inclined surface 208b is greater than a vertical distance VD between the top end T and the bottom end B. Also, a cross-sectional profile of the above-mentioned inclined surface 208b is non-linear in this embodiment. As shown in FIG. 4B, the cross-sectional profile is a monotonic curve.

Figure 5:
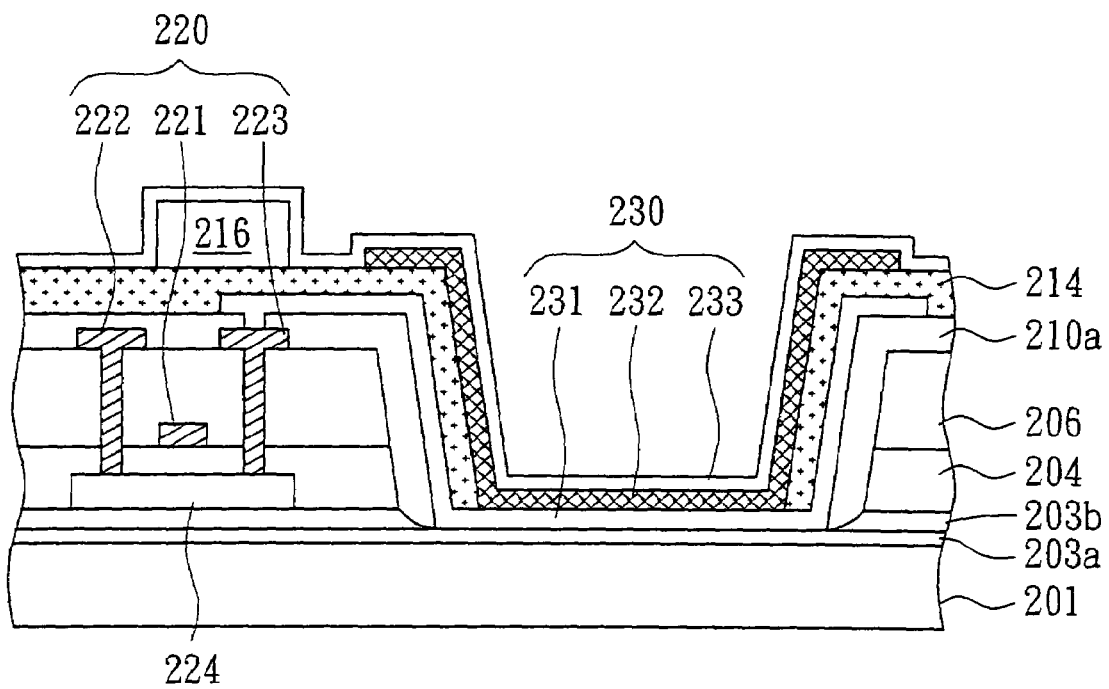
FIG. 5 is a cross-sectional view showing another display device manufactured according to the first embodiment of the invention.

Although a single buffer layer 203 is illustrated in FIGS. 4A~4F, the invention is not so limited. The buffer layer could comprise several layers. FIG. 5 is a cross-sectional view showing another display device manufactured according to the method of the first embodiment of the invention. The display device of FIG. 5 includes two buffer layers. A first buffer layer or barrier layer 203a is formed on the upper surface of the substrate 201, and a second buffer layer 203b is formed on the first buffer layer 203a. The buffer layer 203a is positioned at the bottom side of the recess region 208, between the first electrode 231 and the substrate 201. It also is to be noted that the buffer layer 203 of FIG. 4F and the first buffer layer 202 of FIG. 5 (i.e. the barrier layer) formed on the upper surface of the substrate 201 are positioned below the first electrode 231 and the switch element 220 according to the first embodiment of the invention. Also, the bottom surface of the recess region is lower than the bottom surface of the active layer 224.

Second Embodiment

FIG. 6A~FIG. 6F are cross-sectional views showing a method of manufacturing a display device according to the second embodiment of the invention. In the second embodiment, the bottom surface of the recess region is lower than the upper surface of the substrate.

Figure 6A:
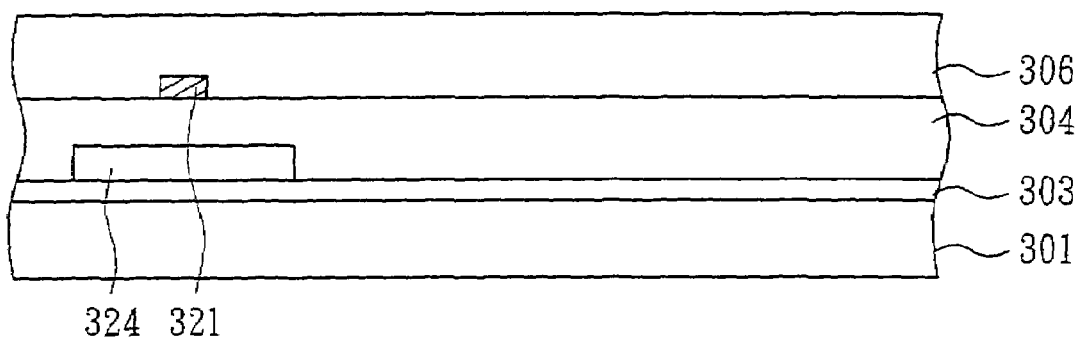
FIG. 6A~FIG. 6F are cross-sectional views showing a method of manufacturing a display device according to the second embodiment of the invention.

First, a substrate 301 is provided, and at least a buffer layer 303 is formed on its upper surface. The substrate 301 could be made of rigid or soft material, and the buffer layer 303 could be a single layer or multiple layers. A single buffer layer 303 is illustrated in the second embodiment. Then, an active layer 324 is formed on the buffer layer 303, and a gate insulating layer 304 is formed on the buffer layer 303 and covers the active layer 304, as shown in FIG. 6A. Next, a gate electrode 321 is formed on the gate-insulating layer 304, and a dielectric layer 306 is formed on the gate-insulating layer 304 to cover the gate electrode 321. The dielectric layer 306 could be a single layer or a multiple layers (comprising oxide and nitride layers). In this embodiment, a single dielectric layer 306 is taken for illustration.

Figure 6B:
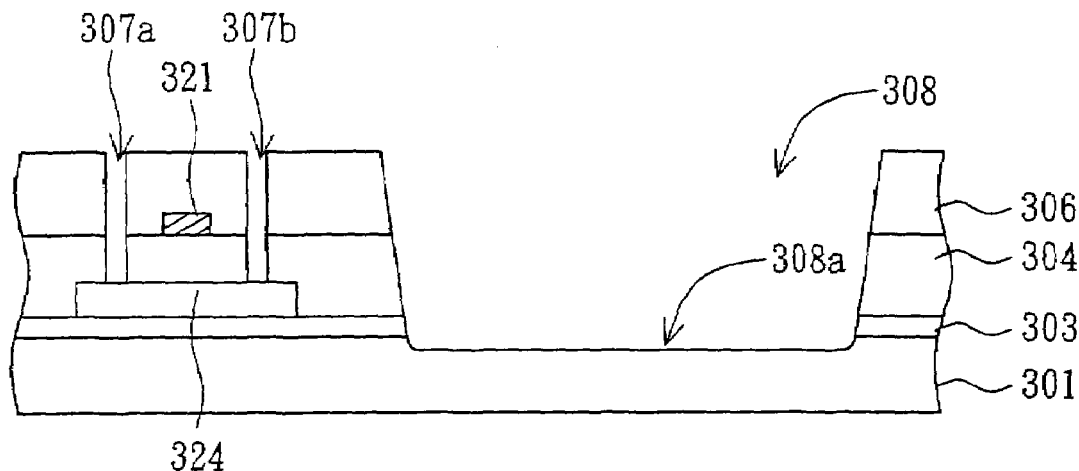

Next, a recess region 308 is formed with a bottom surface 308a lower than not only the bottom surface of the active layer 324 but also the upper surface 301a of the substrate 301, as shown in FIG. 6B. Also, holes 307a and 307b are formed to expose part of the surface of the active layer 324. In a practical application, the recess region 308 could be lower than the upper surface 301a of the substrate 301 by 3000 Å to 4000 Å, but the invention is not limited thereto.

Figure 6C:
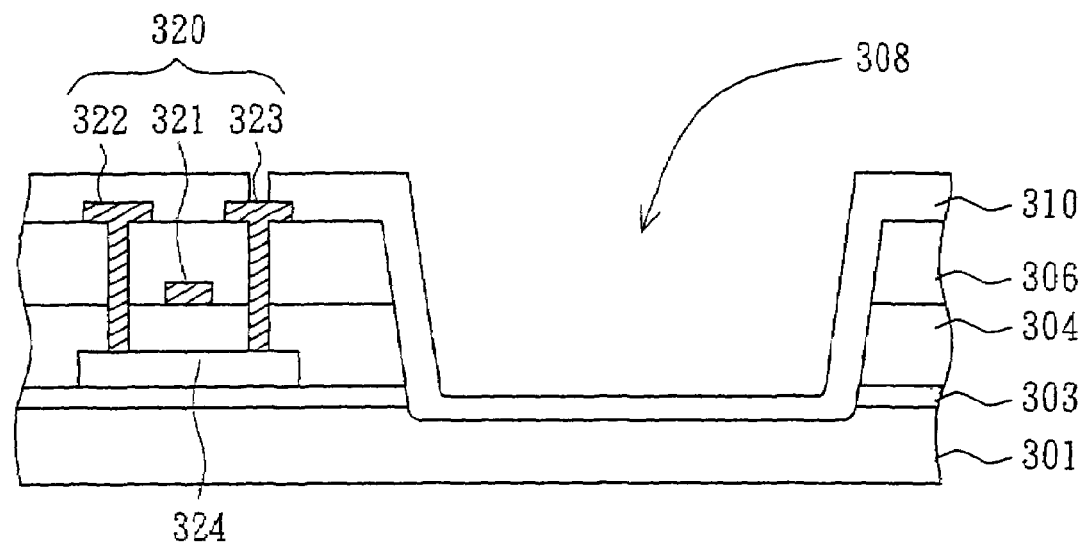

Afterward, referring to FIG. 6C, a second metal layer (not shown) is disposed on the dielectric layer 306 and then patterned to form the source 322 and the drain 323. The holes 307a and 307b (FIG. 6B) are filled with the second metal layer. Thus, the source 322 and the drain 323 are electrically connected to the active layer 324 through the second metal layer. As shown in FIG. 6C, a switch element 320, including the gate electrode 321, source 322 and drain 323, now has been constructed on the substrate 301. Then, an insulating layer 310, such as a silicon nitride layer, is deposited on the dielectric layer 306 to cover source 322, drain 323, and recess region 308. Also, a contact hole 312 is formed on the insulating layer 310 to expose part of the drain 323.

Figure 6D:
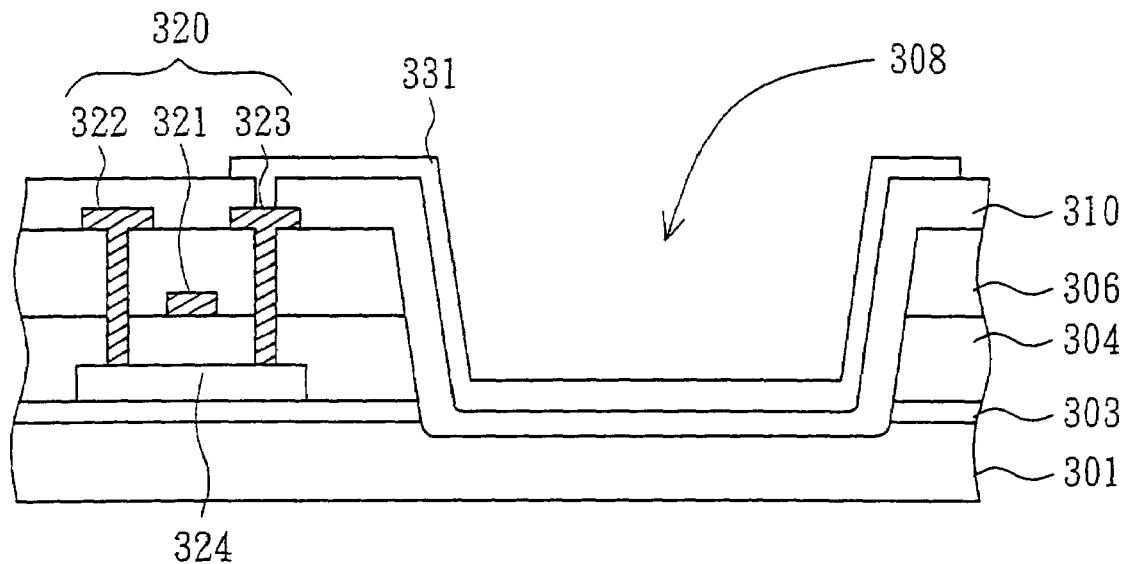

Referring to FIG. 6D, then, a first electrode 331, such as a transparent indium tin oxide (ITO) layer, is formed and patterned above the insulating layer 310. The first electrode 331 covers the recess region 308, and fills the contact hole 312 for electrically connection to the drain 323. As shown in FIG. 6D, the insulating layer 310 (as a barrier layer) is disposed between the first electrode 331 and the substrate 301 at the bottom side and sidewalls of the recess region 308.

Figure 6E:
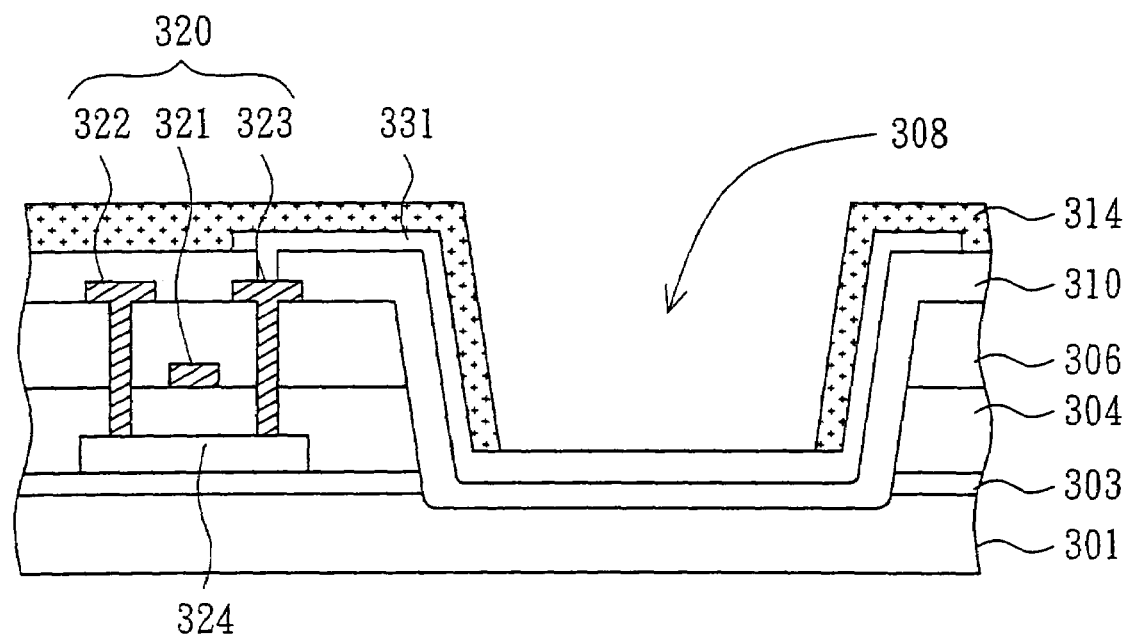

Next, as shown in FIG. 6E, a passivation layer 314 is formed above the insulating layer 310 and covers the first electrode 331. Then, part of the passivation layer 314 is removed to expose the bottom side of the recess region 308. As shown in FIG. 6E, the passivation layer 314 covers the sidewalls of the recess region 308, but no passivation residues remain on the bottom of the recess region 308.

Figure 6F:
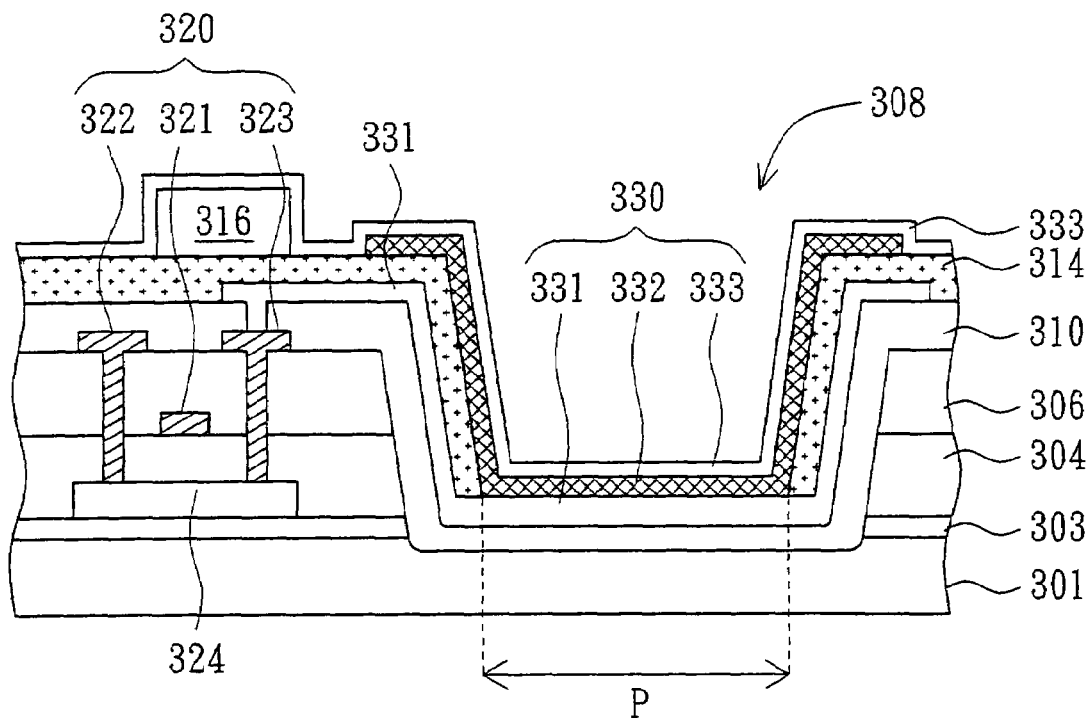

Next, as shown in FIG. 6F, a spacer 316 optionally is formed on the passivation layer 314 for supporting the shadow mask, which is used to define the deposition area of the following light-emitting layer. Subsequently, a light-emitting layer 332 (such as multiple organic electroluminescent layers) are formed on the passivation layer 314, and a second electrode 333 is then formed to cover the spacer 316 and the light-emitting layer 332, as shown in FIG. 6F. The light-emitting element 330, including the first electrode 331, the light-emitting layer 332 and the second electrode 333, has now been constructed. In this embodiment, it is noted that the light-emitting layer 332 contacts only the first electrode 331 at the bottom side of the recess region 308 (within the light-emitting (pixel) area denoted as "P"). Similarly to the structure disclosed in the first embodiment, the light-emitting layer 332 and the first electrode 331 are separated by the passivation layer 314 at the sidewalls of the recess region 308. According to the second embodiment, the insulating layer 310 (as the barrier layer) is formed on the switch element 320 and covers sidewalls and the bottom surface of the recess region 308, so that the first electrode 331 and the substrate 301 are separated by the insulating layer 310.

According to the method of the second embodiment, the defects such as those produced by the undesirable particles 191 in FIG. 2C, and protrusions in FIG. 3 can be removed, and the display quality can be increased. Also, it possesses the advantage of taper-angle improvement that the gate insulating layer 304 and the dielectric layer 306 are covered by the insulating layer 310. With a portion of the insulating layer 310 formed at the sidewalls of the recess region 308, the layers subsequently laminated on the insulating layer 310 can be well deposited layer-by-layer.

According to the aforementioned description, the display devices manufactured using the methods of the invention have specific features, and possess several advantages. Structurally, there is no direct contact between the first electrodes 231 and 331 and the respective substrates 201 and 301. A barrier layer between the first electrode (231 or 331) and the substrate (201 or 301) could be the buffer layer 203 on the upper surface of the substrate (first embodiment, FIG. 4F), the buffer layer 203a on the upper surface of the substrate (FIG. 5), or the insulating layer 310 (second embodiment, FIG. 6F). Also, the recess regions close to the upper surfaces of the substrates (such as expose the buffer layer on the substrate, or located beneath the upper surfaces of the substrate) can effectively remove the undesirable in-film particles or the unsmooth surface encapsulated in the film. Accordingly, the short-circuited phenomenon between the first electrode and the second electrode caused by a protruding projection, and the phenomenon of light scattering or light absorption owing to the above-mentioned defects can be eliminated, so that the production yield of the display device can be greatly improved, and a stable quality of the product can be obtained.

Figure 7:
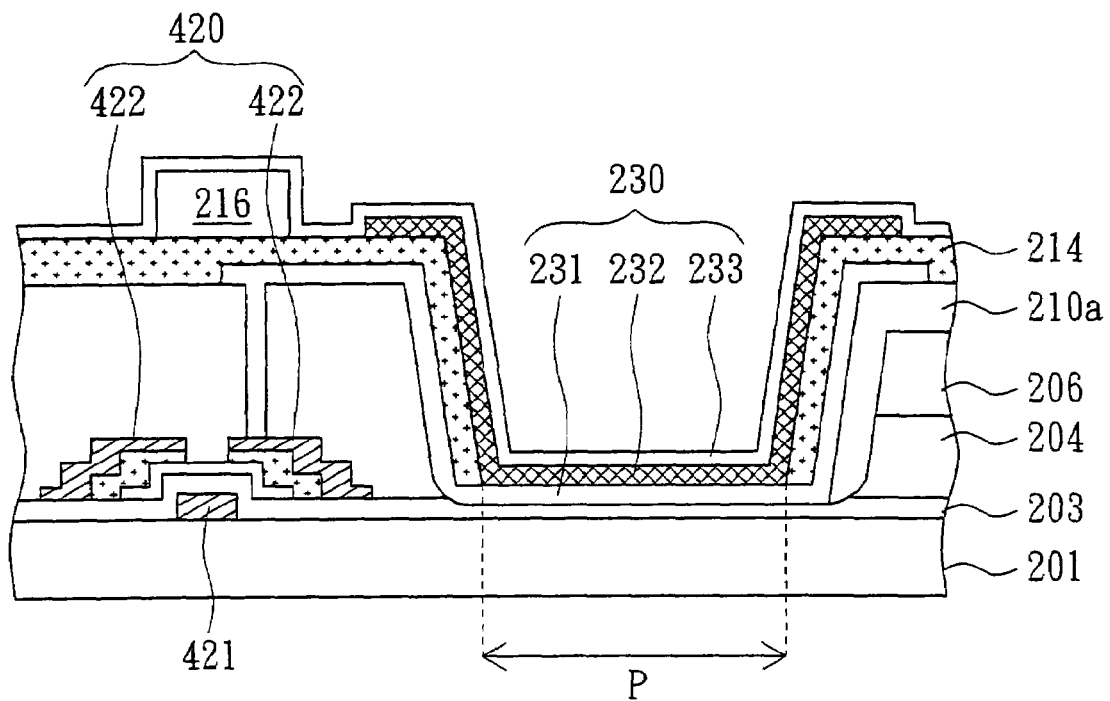
FIG. 7 is a cross-sectional view showing a display device with a bottom gate structure according to the invention.

Although the embodiments show the switching element with a top gate structure here, the invention is not limited thereto. For example, a person with ordinary skill in the art would understand that a switching element with a bottom gate structure also could be used in accordance with this invention. The structures and manufacturing processes of the top-gate display device and the bottom-gate display device are the same except the structures of the switch element. Referring to FIG. 7, which is a cross-sectional view showing a display device with a bottom gate structure according to the invention, the difference between the top-gate display device (as shown in FIG. 4F) and the bottom-gate display device (as shown in FIG. 7) is the structure of the switch element. As shown in FIG. 7, the switch element 420, formed by an amorphous silicon process, includes a gate electrode 421 and two source/drain regions 422 disposed on the substrate 201. The active layer 424 is formed on the buffer layer 203 and the buffer layer 203 acts as a gate insulating layer to separate the gate electrode 421 and active layer 424. The switch element 420 is electrically connected to the light-emitting element 230. Other details of the display device structure of FIG. 7 are identical to that of FIG. 4F, including the first electrode 231 separated from the substrate 201 by a barrier layer (i.e. the buffer layer 203), the barrier layer formed on the upper surface of the substrate and positioned below the first electrode, etc.

While the invention has been described by way of examples and in terms of the above-described embodiments, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display device, comprising:
    a substrate having an upper surface;
    a recess region over the substrate, the recess region having a bottom surface;
    a light-emitting element, which includes
        a first electrode on the recess region,
        a barrier layer formed in contact with and between the first electrode and the substrate, the barrier layer separating the first electrode from the substrate,
        a light-emitting layer on the first electrode, and
        a second electrode on the light-emitting layer;
    a switch element, disposed on the substrate and electrically connected to the light-emitting element; and
    an active layer, beneath the switch element and electrically connected to the switch element;
    wherein the active layer is formed on the barrier layer and the recess region bottom surface is lower than a bottom surface of the active layer.

2. The display device according to claim 1, wherein
    at least a portion of the barrier layer is formed at sidewalls of the recess region.

3. The display device according to claim 1, wherein the barrier layer is formed on the substrate upper surface and positioned below the first electrode and the switch element, so that the first electrode and the substrate are separated by the barrier layer.

4. The display device according to claim 3, wherein the recess region bottom surface exposes a top surface of the barrier layer.

5. The display device according to claim 1, wherein the recess region bottom surface is lower than the substrate upper surface.

6. The display device according to claim 5, wherein the recess region bottom surface is lower than the substrate upper surface by 3000 Å to 4000 Å.

7. The display device according to claim 1, wherein the barrier layer is in direct contact with the switch element.

8. The display device according to claim 1, further comprising a passivation layer above the first electrode and at sidewalls of the recess region.

9. The display device according to claim 8, wherein the light-emitting layer and the first electrode are separated by the passivation layer at the recess region sidewalls.

10. The display device according to claim 1, wherein the switch element includes a source and a drain, electrically connected to the active layer.

11. The display device according to claim 1, wherein the light-emitting layer contacts only the first electrode at a bottom side of the recess region.

12. The display device according to claim 1, wherein the recess region has sidewalls, and has an inclined surface which inclines upward from the recess region bottom surface to the sidewalls.

13. The display device according to claim 12, wherein the inclined surface has a top end and a bottom end, and a horizontal distance between the top end and the bottom end is greater than a vertical distance between the top end and the bottom end.

14. The display device according to claim 12, wherein a cross-sectional profile of the inclined surface is non-linear.

15. The display device according to claim 14, wherein the cross-sectional profile of the inclined surface is a monotonic curve extending upward from the bottom surface to the sidewalls.

16. The display device according to claim 1, wherein the switch element is a thin film transistor (TFT).

17. The display device according to claim 1, wherein the light-emitting element is an organic light-emitting diode (OLED).

18. A display device, comprising:
a substrate having an upper surface;
a plurality of sub-pixels, each sub-pixel including a recess region over the substrate, the recess region having a bottom surface;
a light-emitting element, including
a first electrode on the recess region,
a barrier layer formed in contact with and between the first electrode and the substrate, the barrier layer separating the first electrode from the substrate,
a light-emitting layer on the first electrode, and
a second electrode on the light-emitting layer;
a switch element including a gate electrode, a source, and a drain, the switch element being disposed on the substrate upper surface and electrically connected to the light-emitting element; and
an active layer, beneath the switch element and electrically connected to the source and the drain;
wherein the recess region bottom surface is lower than a bottom surface of the active layer and the substrate upper surface, the recess region has sidewalls, and the barrier layer is formed on the switch element and covers the sidewalls and the bottom surface of the recess region, so that the first electrode and the substrate are separated by the barrier layer.

19. The display device according to claim 18, wherein at least a portion of the barrier layer is formed at sidewalls of the recess region.

20. The display device according to claim 18, wherein the barrier layer is formed on the substrate upper surface and positioned below the switch element and the first electrode, so that the first electrode and the substrate are separated by the barrier layer.

21. The display device according to claim 18, wherein the recess region bottom surface exposes a top surface of the barrier layer.

22. The display device according to claim 18, wherein the recess region bottom surface is lower than the substrate upper surface.

23. The display device according to claim 18, wherein a passivation layer is formed above the first electrode and at sidewalls of the recess region.

24. The display device according to claim 23, wherein the light-emitting layer and the first electrode are separated by the passivation layer at the recess region sidewalls.

25. The display device according to claim 18, wherein the recess region has an inclined surface, which inclines upward from the recess region bottom surface to sidewalls of the recess region.

26. The display device according to claim 25, wherein the inclined surface has a top end and a bottom end, and a horizontal distance between the top end and the bottom end is greater than a vertical distance between the top end and the bottom end.

27. The display device according to claim 25, wherein a cross-sectional profile of the inclined surface is non-linear.

28. The display device according to claim 27, wherein the cross-sectional profile of the inclined surface is a montonic curve extending upward from the bottom surface to the sidewalls.

29. The display device according to claim 18, wherein the switch element is a thin film transistor (TFT).

30. The display device according to claim 18, wherein the light-emitting element is an organic light-emitting diode (OLED).

31. The display device according to claim 18, wherein the light-emitting layer contacts only the first electrode at a bottom side of the recess region.

* * * * *